United States Patent [19]
McIlvanie

[11] Patent Number: 5,422,764
[45] Date of Patent: Jun. 6, 1995

[54] ELECTRICAL INTERCONNECT FOR A HEAD/ARM ASSEMBLY OF COMPUTER DISK DRIVES

[75] Inventor: Bill McIlvanie, Boise, Id.

[73] Assignee: Hewlett-Packard Company, Palo Alto, Calif.

[21] Appl. No.: 138,292

[22] Filed: Oct. 15, 1993

[51] Int. Cl.⁶ ............................................. G11B 5/012
[52] U.S. Cl. .................................. 360/97.01; 360/106
[58] Field of Search .................... 360/97.01, 105–106, 360/108

[56] References Cited

U.S. PATENT DOCUMENTS

| | | | |
|---|---|---|---|
| 4,879,620 | 11/1989 | Yamashita | 360/104 X |
| 5,012,368 | 4/1991 | Bosier et al. | 360/104 x |
| 5,095,396 | 3/1992 | Putnam et al. | 360/97.01 X |

*Primary Examiner*—A. J. Heinz

[57] ABSTRACT

A disk drive has an electrical interconnect for coupling one or more conductors provided on an actuator arm to a flexible connector. The interconnect consists of one or more tabs extending beyond a peripheral edge of the actuator arm and one or more slots formed on the flexible connector to receive the tabs. After the tabs are inserted into the corresponding slots, the tabs and flexible connector define L-shaped joints. Solder beads are deposited in these L-shaped joints to electrical couple the actuator arm to the flexible connector.

16 Claims, 5 Drawing Sheets

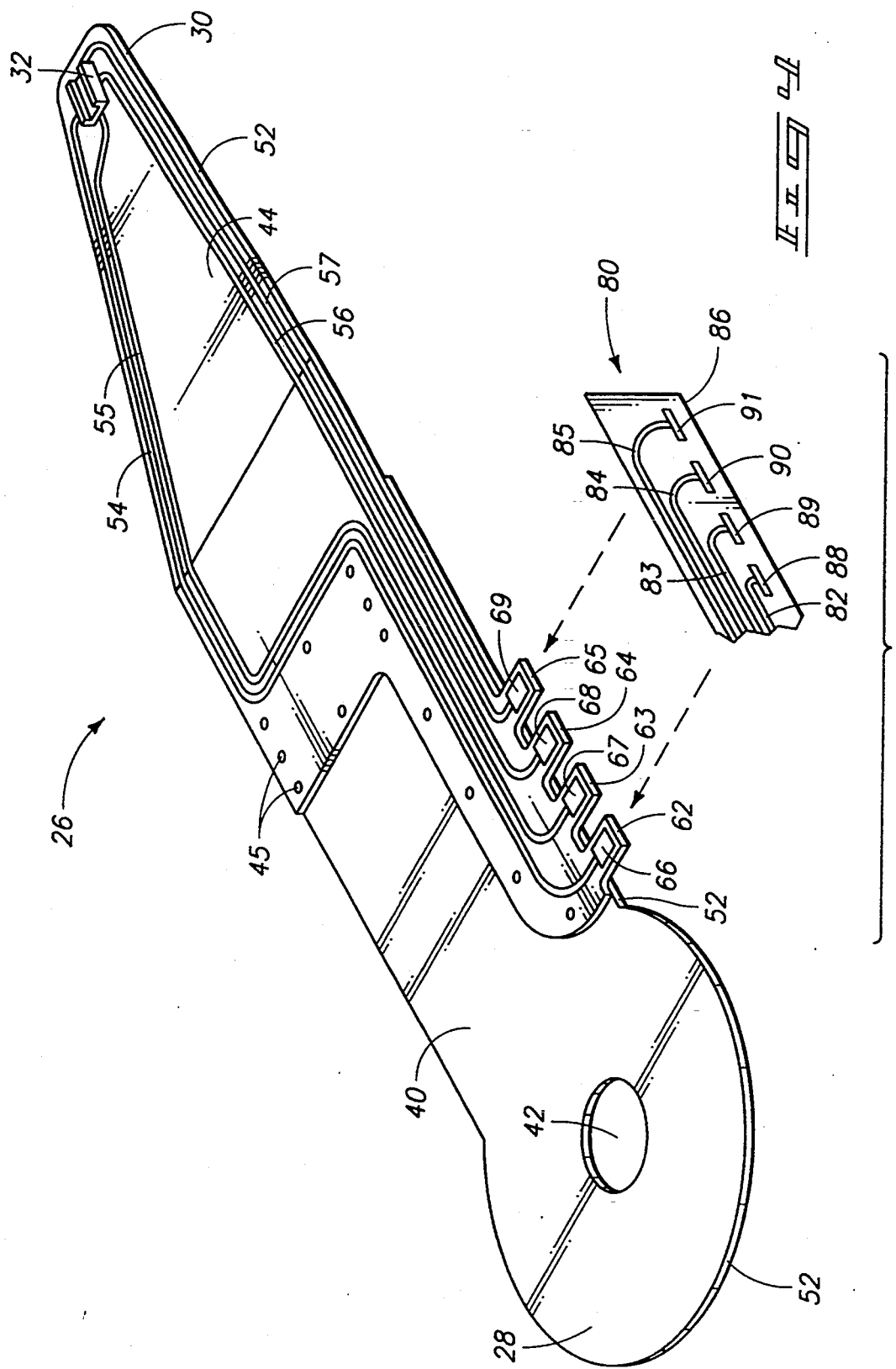

ELECTRICAL INTERCONNECT FOR A HEAD/ARM ASSEMBLY OF COMPUTER DISK DRIVES

FIELD OF THE INVENTION

This invention relates to computer disk drives.

BACKGROUND OF THE INVENTION

Conventional computer disk drives have one or more actuator arms which are moveable relative to one or more corresponding rotatable magnetic disks. The movable actuator arm extends across the disk to position a magnetic head radially over concentric tracks in the disk.

This invention relates to the problems associated with electrically interfacing the magnetic head with electronic circuitry located external to the actuator arm. The most common interfacing technique is to hand solder each conductive lead on the actuator arm to a flexible circuit. The flexible circuit is designed to bend and yield as the actuator arm is moved across the magnetic disk. The hand soldering technique is labor intensive and results in increased manufacturing costs.

An automated technique involving thermal compression bonding has also been introduced, but has not been widely accepted within the industry at this time.

This invention introduces a new technique for electrically interconnecting the actuator arm to the flexible circuit. The resulting interconnect is durable and conducive to automation.

SUMMARY OF THE INVENTION

According to one aspect of this invention, a disk drive has at least one storage disk and at least one actuator arm movable relative to the storage disk. The actuator arm supports and radially positions a read/write head across the disk. One or more conductors are provided on the actuator arm, with each conductor having a first end electrically coupled to the read/write head and a second end. The actuator arm has a shape defined by a peripheral edge running about its perimeter. A tab portion extends beyond the peripheral edge of the actuator arm. One or more conductive pads are provided on the tab and are electrically coupled to the second ends of the conductors on the actuator arm. A flexible connector is positioned adjacent to the actuator arm. The connector has one or more conductive traces formed on a flexible non-conductive layer. A slot is formed in the connector adjacent to the conductive traces and sized to receive the tab of the actuator arm. Once the tab is inserted into the slot, the conductive pads on the tab are electrically coupled to the conductive traces on the flexible connector.

DESCRIPTION OF THE DRAWINGS

Preferred embodiments of the invention are described below with reference to the following accompanying drawings depicting examples embodying the best mode for practicing the invention.

FIG. 4 is an exploded perspective view of the FIG. 2 actuator arm being interconnected to a flexible connector.

DETAILED DESCRIPTION OF THE INVENTION

Figure 1:
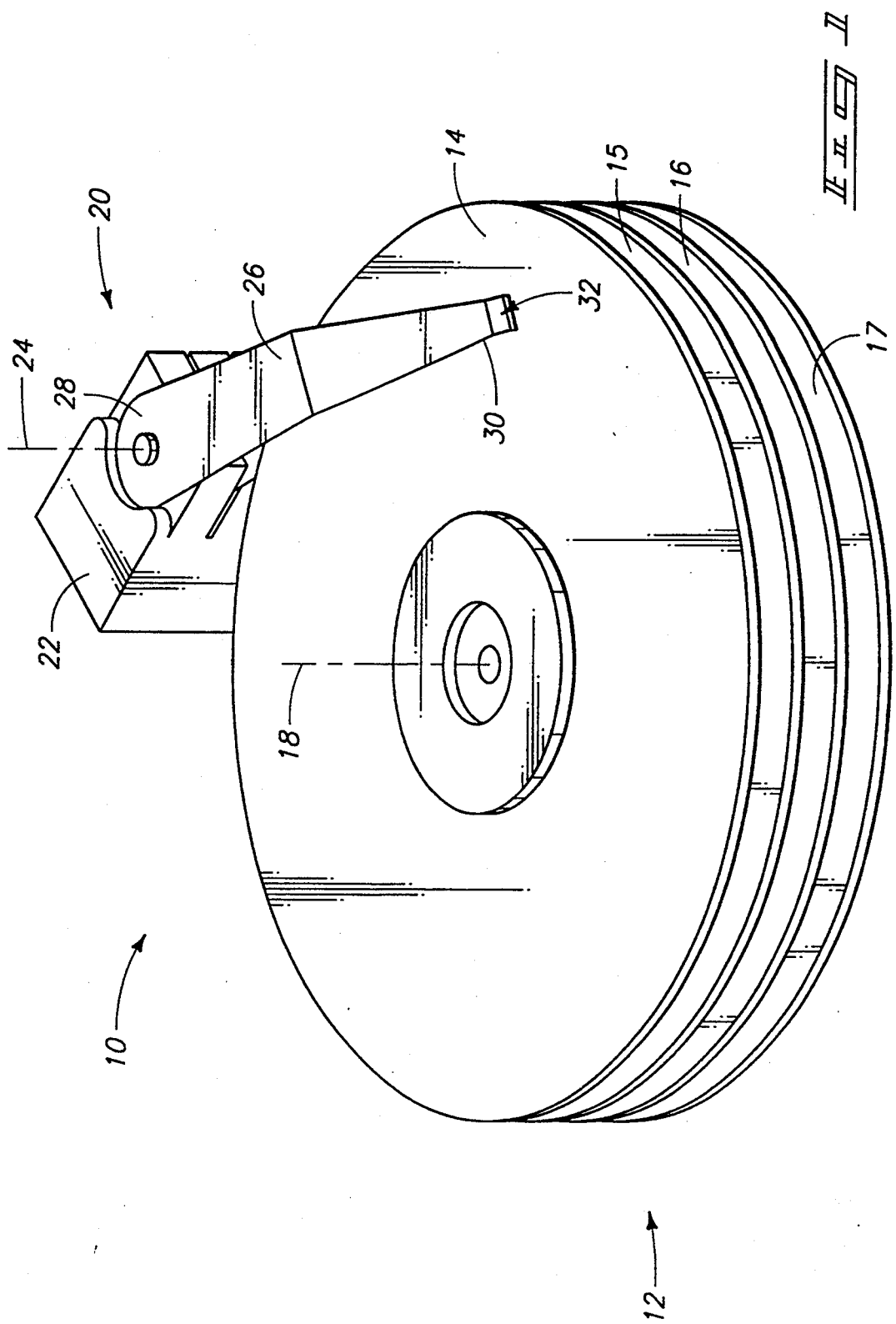
FIG. 1 is a diagrammatical perspective view of a computer disk drive of this invention.

FIG. 1 shows a disk drive 10 (such as an embedded servo disk drive or a dedicated servo disk drive) having a stacked array 12 of multiple magnetic disks 14–17 aligned along a central axis of rotation 18. The magnetic disks 14–17 are supported by a spindle assembly and rotated at a substantially constant speed by a motor or other drive mechanism (not shown). Individual magnetic disks have many concentric tracks for storing data and servo information.

A head/arm assembly 20 is positioned adjacent to the stacked disk array 12. The head/arm assembly 20 includes a fixed housing or frame 22 and multiple actuator arms which are controllably pivoted about an axis 24 relative to frame 22. Only one actuator arm 26 is shown in FIG. 1, but other actuator arms are aligned beneath arm 26 such that one or two arms are provided for each magnetic disk 14–17. The rotary actuator arms are thereby movable relative to storage disks 14–17.

Figure 2:
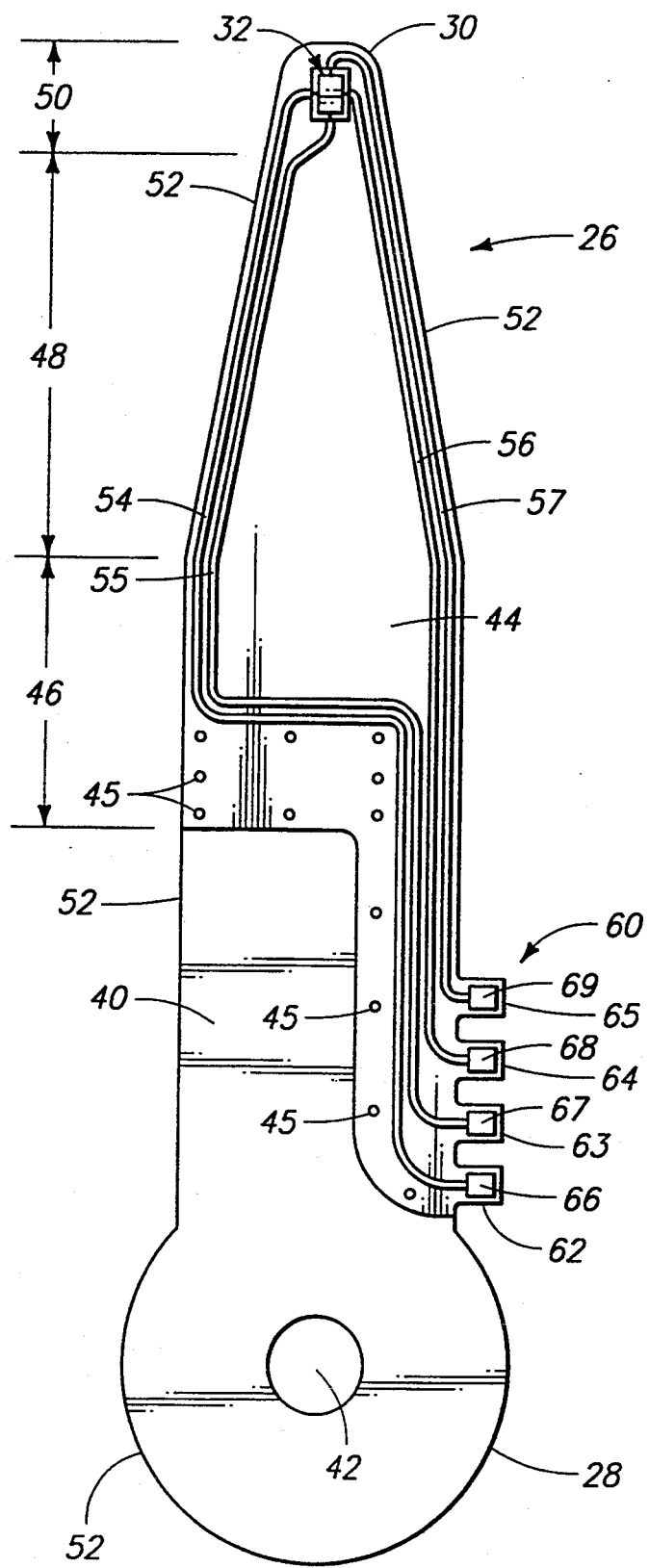
FIG. 2 is a top view of an actuator arm employed in the FIG. 1 disk drive. The actuator arm is constructed according to a first embodiment having multiple extension tabs.

As shown in FIGS. 1 and 2, actuator arm 26 has a proximal end 28 operatively coupled to frame 22 and a distal end 30 suspended above upper disk 14. A head gimbal assembly 32 is mounted at distal end 30 of actuator arm 26. The head gimbal assembly includes a slider physically connected via a gimbal mount to actuator arm 26 and a magnetic read/write head installed on the slider. The read/write head transfers data and servo information to and from storage disk 14. According to this arrangement, actuator arm 26 supports and radially positions the read/write head above the desired concentric tracks of disk 14 as actuator arm 26 is controllably rotated about axis 24.

As shown in FIGS. 2 and 4, actuator arm 26 comprises an arm portion 40 at its proximal end 28. Arm portion 40 includes an annular opening 42 for mounting the actuator arm to frame 22. Arm portion 40 is preferably formed of non-magnetic material, such as stainless steel. Actuator arm 26 further includes a suspension member 44 attached to the arm portion 40 via spot welds 45. Suspension member 44 is also formed of non-magnetic material, such as stainless steel. The composite actuator arm 26 has an exterior shape or outlining contour defined by a peripheral edge 52 which runs entirely around its perimeter. Accordingly, arm portion 40 defines a segment of peripheral edge 52 at the proximal end of actuator arm 26 and suspension member 44 defines another segment of peripheral edge 52 at the distal end of actuator arm 26.

Suspension member 44 consists of a bend region 46 adjacent to and partially overlapping the arm portion 40, an intermediate load beam region 48, and a head gimbal assembly region 50 having an etched opening to support the head gimbal assembly 32. Bend region 46 angles load beam region 48 away from the plane containing arm portion 40 toward storage disk 14. During operation, however, the actuator arm 26 is pressed against the disk to ensure proper contact, whereby this applied pressure causes the load beam 48 to straighten and approximately align with arm portion 40.

Actuator arm 26 has multiple conductors 54–57 provided thereon which are preferably formed of copper or aluminum. The conductors are patterned and deposited onto the stainless steel suspension member 44, over an insulating material such as is known in the printed circuit art. Alternatively, a flexible polyamide or equivalent based connection pattern may be adhered to the surface of suspension member 44. Individual conductors have a first end electrically coupled to the read/write head of head gimbal assembly 32 and a second end positioned near proximal end 28. The number of conductors depends upon the type of read/write head. Less conductors are used for more simple read/write heads, such as common inductive heads; whereas, more conductors are employed for sophisticated heads, such as magneto resistive heads.

Figure 3:
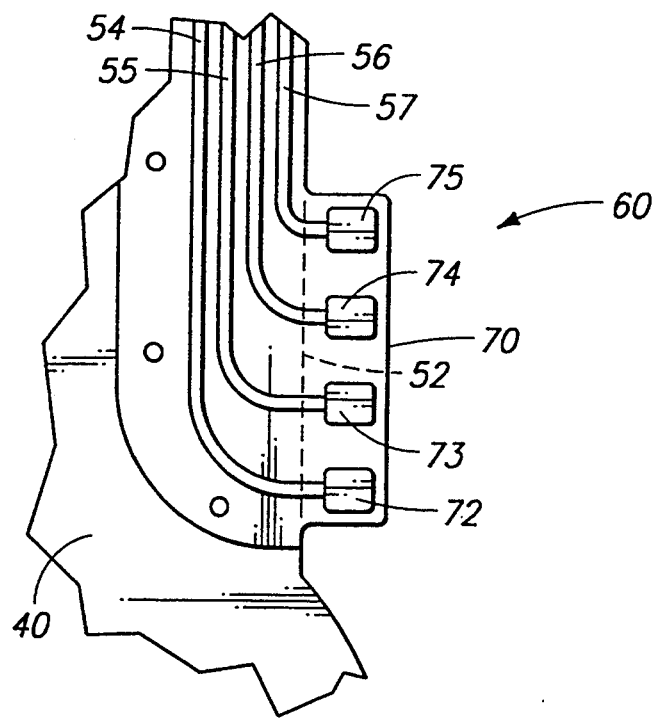
FIG. 3 is an enlarged, partial top view of the FIG. 2 actuator arm, but illustrates a single extension tab according to a second embodiment of this invention.

In FIGS. 2 and 3, actuator arm 26 has a tab region 60 adjacent to proximal end 28. Tab region 60 consists of one or more tabs which extend beyond the peripheral edge 52 (shown in phantom beneath the tab region in FIG. 3) of the arm portion 40 of actuator arm 26. Tab portion 60 is preferably formed with actuator arm 26, and more particularly, with suspension member 44 as a single, integral unit of stainless steel, as opposed to being an add-on piece of material. Thus, when suspension member 44 is overlaid partially on arm portion 40 and welded thereto, the tab region 60 projects outwardly beyond the peripheral edge segment 52 defined by arm portion 40 to facilitate an improved electrical interconnection, as will be described in the continuing discussion.

According to a first embodiment of FIG. 2, multiple tabs 62–65 project beyond peripheral edge 52. One tab is associated with each conductor on the actuator arm 26. Conductive pads 66–69 (i.e., copper or aluminum) are provided on corresponding tabs 62–65 and are electrically connected to the second ends of respective conductors 54–57. According to a second embodiment of FIG. 3, the tab region 60 consists of a single tab 70 with multiple conductive pads 72–75 formed thereon. As above, the second ends of associated conductors 54–57 are electrically coupled to respective conductive pads 72–75.

The one or more tabs preferably extend within the same plane as bend region 46 of suspension member 44, as is shown in the figures. Alternatively, the tabs can project beyond edge 52 at an angle relative to the plane containing bend region 46. For instance, the tabs can be constructed to extend at right angles (90°) relative to the bend region 46.

With reference to FIG. 4, the head/arm assembly 20 of disk drive 10 includes a flexible circuit or connector 80 which electrically interfaces with the actuator arm 26. Flexible connector 80, sometimes referred to as an "arm stack flex circuit", is positioned adjacent to proximal end 28 of actuator arm 26 and housed within frame 22 (FIG. 1). Flexible connector 80 busses signals between the read/write head and the disk drive control circuitry, such as servo timing generators and microcomputers, which is located external to the actuator arms. The control circuitry is well known in the art of computer disk drives and will not be described herein.

The flexible connector is preferably formed of one or more conductive traces 82–85 (such as aluminum or copper) patterned and formed on a flexible non-conductive layer 86 (such as Mylar or polyamide). The flexible connector bends and moves as the actuator arm is rotated.

FIGS. 4–7 illustrate various embodiments of a coupling means for electrically connecting the conductive pads on tab portion 60 to the conductive traces 82–85 on flexible connector 80. According to the first and most preferred embodiment of FIGS. 4 and 5, multiple slots 88–91 are formed in flexible connector 80 adjacent to respective conductive traces 82–85. Slots 88–91 are sized and shaped to receive corresponding tabs 62–65. When tabs 62–65 are inserted through respective slots 88–91 (FIG. 5), they form L-shaped joints whereby the tabs are angled approximately 90° relative to flexible connector 80. Solder beads 93 are deposited in the L-shaped joints to electrically couple conductive pads 66–69 of tabs 62–65 to corresponding traces 82–85. The soldered L-shaped joints are highly durable. The solder beads 93 are preferably applied using solder reflow techniques under infrared energy. However, other techniques for depositing solder, or other conductive joining materials, may also be employed.

Figure 6:
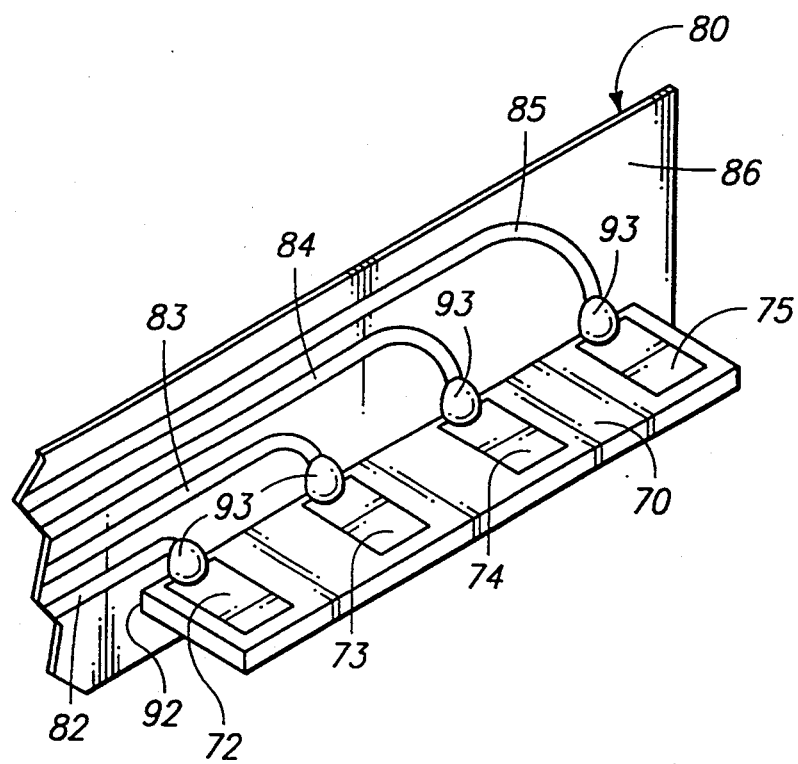
FIG. 6 is an enlarged, partial perspective view showing the single tab of the second embodiment interconnected to the flexible connector.

According to the second embodiment of FIG. 6, a single slot 92 is formed in flexible connector 80 and configured to receive single tab 70. Solder beads 93 are deposited to electrically connect conductive pads 72–75 on tab 70 to corresponding traces 82–85.

Figure 5:
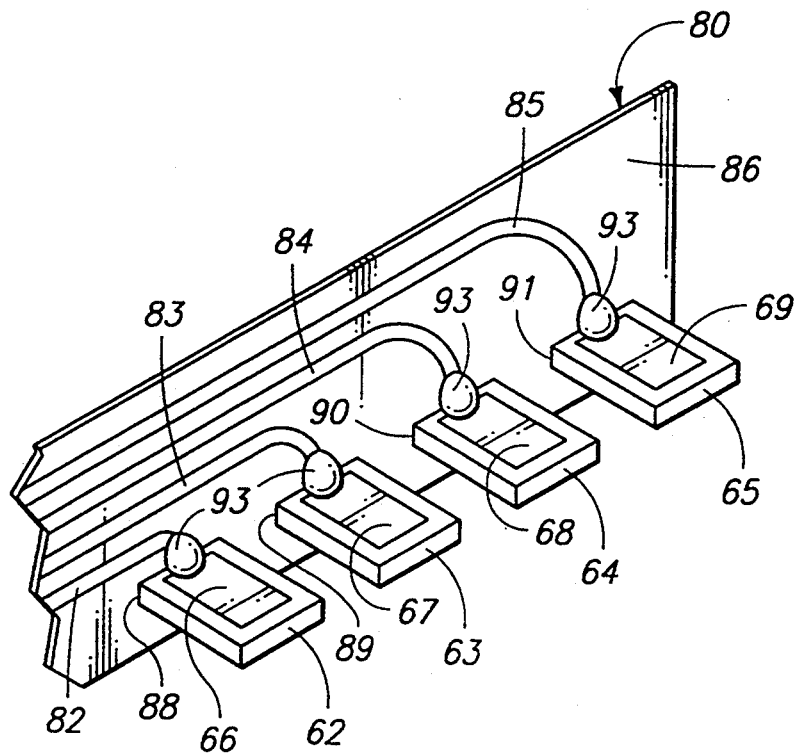
FIG. 5 is an enlarged, partial perspective view showing the multiple tabs of the first embodiment interconnected to the flexible connector.

As a slight variation of the FIGS. 4–6 embodiments, tabs 62–65 or tab 70 (FIG. 6) are angled relative to the plane containing the bend region 46 of suspension member 44 and flexible connector 80 is connected directly to the tab(s). In this modified structure, the flexible connector 80 can be formed without slots 88–91 or 92. The pads on the tabs are electrically coupled to the corresponding traces on flexible connector 80 via thermal compression bonding methods, or other techniques.

Figure 7:
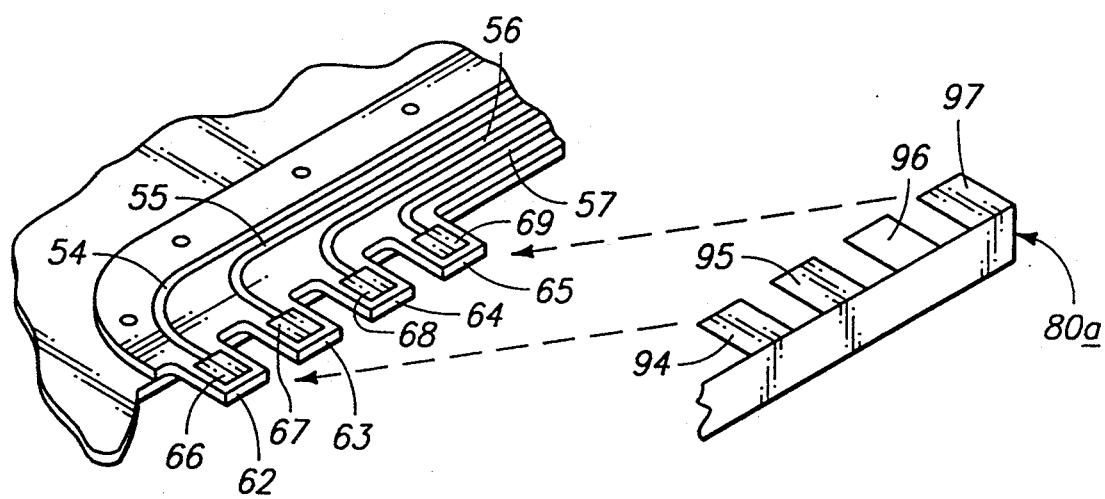
FIG. 7 is an enlarged, exploded, partial perspective view of the FIG. 2 actuator arm being interconnected to a flexible connector according to a third embodiment of this invention.

According to a third embodiment of FIG. 7, a slightly modified flexible connector 80a is configured with multiple projections 94–97. These projections are dimensioned and spaced to overlay corresponding tabs 62–65. Thermal compression bonding techniques are used to electrically connect the conductive pads 66–69 of tabs 62–65 to corresponding traces (not shown in this view) on flexible connector 80.

The electrical interconnect employed in the disk drive of this invention is advantageous over prior art hand soldered interconnects. The unique interconnect is easy to assemble and conducive to automated processes, thereby reducing manufacturing costs.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:
1. A disk drive comprising:
   at least one storage disk;

at least one actuator arm movable relative to the storage disk, the actuator arm supporting and radially positioning a read/write head across the disk, the actuator arm having a shape defined by a peripheral edge;

a conductor provided on the actuator arm having a first end electrically coupled to the read/write head and a second end;

a tab extending beyond the peripheral edge of the actuator arm, the tab and the actuator arm being integrally formed as a single unit of a single piece of material; and a conductive pad provided on the tab, the conductive pad being electrically coupled to the second end of the conductor.

2. A disk drive according to claim 1 wherein:

the actuator arm comprises an arm portion and a suspension member mounted to the arm portion;

the arm portion defines a segment of the peripheral edge of the actuator arm; and the tab is integrally formed with the suspension member so that when the suspension member is mounted to the arm portion, the tab extends beyond the peripheral edge segment defined by the arm portion.

3. A disk drive according to claim 1 wherein:

the actuator arm comprises multiple individual tabs extending beyond the peripheral edge of the actuator arm;

the disk drive further comprising: and multiple conductors provided on the actuator arm;

at least one conductive pad provided on the individual tabs and electrically connected to corresponding multiple conductors.

4. A disk drive according to claim 1 wherein the actuator arm defines a plane and the tab extends from the actuator arm in substantially the same plane.

5. A disk drive comprising:

at least one storage disk;

at least one actuator arm movable relative to the storage disk, the actuator arm supporting a radially positioning a read/write head across the disk, the actuator arm having a shape defined by a peripheral edge;

a conductor provided on the actuator arm having a first end electrically coupled to the read/write head and a second end;

a tab extending beyond the peripheral edge of the actuator arm, the tab and the actuator arm being integrally formed as a single unit of stainless steel; and a conductive pad provided on the tab, the conductive pad being electrically coupled to the second end of the conductor.

6. A disk drive according to claim 3 further comprising:

a flexible connector having a conductive trace formed on a flexible non-conductive layer, the connector also having at least one slot formed therein adjacent to the conductive trace, the slot being sized to receive the tab; and means for electrically connecting the conductive pad on the tab to the conductive trace on the flexible connector when the tab is inserted into the slot.

7. A disk drive according to claim 3 further comprising:

a flexible connector having at least one conductive trace formed on a flexible non-conductive layer; and means for electrically connecting the conductive pad on the tab to the conductive trace on the flexible connector.

8. A disk drive according to claim 3 further comprising:

multiple conductors provided on the actuator arm;

multiple tabs extending beyond the peripheral edge of the actuator arm; and at least one conductive pad provided on individual tabs and electrically connected to corresponding multiple conductors.

9. A disk drive comprising:

at least one storage disk;

at least one actuator arm movable relative to the storage disk, the actuator arm supporting and radially positioning a read/write head across the disk, the actuator arm lying in a plane and having a shape defined by a peripheral edge, the actuator arm further having a tab extending beyond the peripheral edge of the actuator arm in substantially the same plane as the actuator arm;

a conductor provided on the actuator arm having a first end electrically coupled to the read/write head and a second end;

a conductive pad provided on the tab, the conductive pad being electrically coupled to the second end of the conductor;

a flexible connector having a conductive trace formed on a flexible non-conductive layer, the connector also having at least one slot formed therein adjacent to the conductive trace, the slot being sized to receive the tab; and means for electrically connecting the conductive pad on the tab to the conductive trace on the flexible connector when the tab is inserted into the slot.

10. A disk drive according to claim 9 wherein the tab and the actuator arm are integrally formed as a single unit of a single piece of material.

11. A disk drive according to claim 9 wherein:

the actuator arm comprises an arm portion and a suspension member mounted to the arm portion;

the arm portion defines a segment of the peripheral edge of the actuator arm; and the tab is integrally formed with the suspension member so that when the suspension member is mounted to the arm portion, the tab extends beyond the peripheral edge segment defined by the arm portion.

12. A disk drive according to claim 9 further comprising:

multiple tabs extending beyond the peripheral edge of the actuator arm, the multiple tabs lying side by side in substantially the same plane as the actuator arm; and the flexible connector having a plurality of slots to receive corresponding tabs.

13. A disk drive according to claim 9 further comprising:

multiple tabs extending beyond the peripheral edge of the actuator arm;

at least one conductive pad provided on individual tabs;

multiple conductors provided on the actuator arm and electrically connected to corresponding conductive pads;

multiple conductive traces provided on the flexible connector; and the flexible connector having a plurality of slots to receive corresponding tabs, the slots being arranged adjacent to the conductive traces, the electrical connecting means coupling the multiple conductive pads on the tabs to associated conductive traces on the flexible connector when the tabs are inserted into the corresponding slots.

14. A disk drive comprising:

at least one storage disk;

at least one actuator arm movable relative to the storage disk, the actuator arm supporting and radially positioning a read/write head across the disk, the actuator arm having an arm portion and a suspension member mounted to the grin portion, the arm portion defining a segment of the peripheral edge of the actuator arm, the suspension member having a tab integrally formed of a single material therewith, the tab extending beyond the peripheral edge segment defined by the arm portion when the suspension member is mounted to the arm portion;

a conductor provided on the actuator arm having a first end electrically coupled to the read/write head and a second end;

a conductive pad provided on the tab, the conductive pad being electrically coupled to the second end of the conductor;

a flexible connector having at least one conductive trace formed on a flexible non-conductive layer; and means for electrically connecting the conductive pad on the tab to the conductive trace on the flexible connector.

15. A disk drive according to claim 14 wherein the electrical connecting means comprises a connection formed through thermal compression bonding.

16. A disk drive according to claim 14 wherein the tab is configured to extend beyond the peripheral edge at an angle relative to the actuator arm.

* * * * *